United States Patent [19]

Singer et al.

[11] Patent Number: 4,639,761
[45] Date of Patent: Jan. 27, 1987

[54] COMBINED BIPOLAR-FIELD EFFECT TRANSISTOR RESURF DEVICES

[75] Inventors: Barry M. Singer, New York, N.Y.; Rajsekhar Jayaraman, Cambridge, Mass.

[73] Assignee: North American Philips Corporation, New York, N.Y.

[21] Appl. No.: 792,221

[22] Filed: Oct. 25, 1985

Related U.S. Application Data

[63] Continuation-in-part of Ser. No. 562,145, Dec. 16, 1983, abandoned.

[51] Int. Cl.[4] ............ H01L 27/02; H01L 29/78; H01L 29/90; H01L 29/00
[52] U.S. Cl. ............... 357/234; 357/23.8; 357/43; 357/13; 357/21; 357/37; 357/89
[58] Field of Search ............... 357/23.8, 23.4, 23.1, 357/13, 43, 21, 37, 89

[56] References Cited

U.S. PATENT DOCUMENTS

| | | | |
|---|---|---|---|
| 4,095,252 | 1/1985 | Ochi | 357/22 |
| 4,233,617 | 11/1980 | Klassen et al. | 357/55 |
| 4,266,238 | 5/1981 | Nishizawa | 357/58 |
| 4,292,642 | 9/1981 | Appels et al. | 357/13 |
| 4,300,150 | 11/1981 | Colak | 357/52 |
| 4,344,081 | 8/1982 | Pao et al. | 357/35 |
| 4,422,089 | 12/1983 | Vaes et al. | 357/22 |

FOREIGN PATENT DOCUMENTS 3029553 3/1982 Fed. Rep. of Germany ........ 357/43

OTHER PUBLICATIONS

Appels et al., "High Voltage Thin Layer Devices (RESURF Devices)", *IEEE International Electron Device Meeting Tech. Digest*, 12/79, pp. 238-241.

Colak et al., "Lateral DMOS Power Transistor Design", *IEEE Electron Device Letters*, vol. EDL-1, No. 4, Apr. 1980, pp. 51-53.

*Primary Examiner*—William D. Larkins
*Assistant Examiner*—R. P. Limanek
*Attorney, Agent, or Firm*—Robert T. Mayer; Steven R. Biren

[57] ABSTRACT

A combined bipolar-field effect transistor RESURF device includes a lightly-doped epitaxial buried layer of a first conductivity type located between a semiconductor substrate of the first conductivity type and an epitaxial surface layer of a second conductivity type opposite to that of the first. The doping concentration and thickness of the epitaxial surface layer are selected in accordance with the Reduced Surface Field (RESURF) technique. A highly-doped buried region of the second conductivity type is located beneath the base region of the device and is sandwiched between the epitaxial buried layer and the epitaxial surface layer. The advantages of such a device include a substantially reduced "on" resistance, a more compact and flexible configuration, improved switching characteristics, reduced base device current requirements, and improved isolation. The device may be further enhanced by providing a buried annular region of the first conductivity type around and in contact with the buried region, and a surface-adjoining annular region of the first conductivity may be provided adjacent the base region.

8 Claims, 3 Drawing Figures

COMBINED BIPOLAR-FIELD EFFECT TRANSISTOR RESURF DEVICES

This is a continuation-in-part of application Ser. No. 562,145, filed Dec. 16, 1983, which is now abandoned.

BACKGROUND OF THE INVENTION

This invention is in the field of bipolar and field effect transistor devices, and relates more particularly to improved combined bipolar-field effect transistor RESURF devices.

The general concept of combining bipolar and field effect transistors in a single device is well-known in the art. For example, combined bipolar-junction field effect transistor devices are shown in U.S. Pat. No. 4,095,252 and *IBM Technical Disclosure Bulletin*, Vol. 19, No. 11, April 1977. Additionally, a combined vertical bipolar-DMOS device is shown in U.S. Pat. No. 4,344,081. Generally speaking, when such devices are used for high-power switching applications, a bipolar transistor and a field effect transistor are combined in order to achieve a single integrated device which features both the faster switching response of the field effect transistor and the lower on-resistance of the bipolar transistor.

In order to achieve a higher level of performance in such devices, an ongoing effort has been made to improve the breakdown and switching characteristics of the devices. For example, it has been found that the breakdown characteristics of high-voltage semiconductor devices generally can be improved by using the REduced SURface Field (or RESURF) technique, as described in "High Voltage Thin Layer Devices (RESURF Devices)", "International Electron Devices Meeting Technical Digest", December, 1979, pages 238-240, by Appels et al, and U.S. Pat. No. 4,292,642, incorporated herein by reference. Essentially, the improved breakdown characteristics of RESURF devices are achieved by employing thinner but more highly doped epitaxial surface layers to reduce surface fields.

The RESURF technique was applied to lateral double-diffused MOS transistors, as reported in "Lateral DMOS Power Transistor Design", "IEEE Electron Device Letters", Vol. EDL-1, pages 51–53, April, 1980, by Colak et al, and the result was a substantial improvement in device characteristics. In high-voltage DMOS devices, there is normally a trade-off between breakdown voltage and on-resistance, with the goal being to increase the breakdown voltage level while maintaining a relatively low on-resistance. Using the RESURF technique, and for reference assuming a constant breakdown voltage, an improvement (e.g. decrease) in on-resistance by a factor of about 3 may be obtained in a device occupying the same area as a conventional (thick epitaxial layer) DMOS device. An additional technique for improving the operating characteristics of DMOS transistors by using buried and surface field shaping layers is shown in U.S. Pat. No. 4,300,150.

Nevertheless, a further improvement in the on-resistance and switching characteristics of such devices would be extremely desirable, particularly for high-voltage power switching devices where such characteristics are of considerable importance. Additionally, for combined bipolar-field effect transistor devices using the RESURF principle, it would be desirable to improve the manufacturing yield and minimize the area occupied by the device for a given set of switching, high-voltage, and on-resistance characteristics.

Such a combined device is described in a U.S. patent application entitled COMBINED BIPOLAR-FIELD EFFECT TRANSISTOR RESURF DEVICES, by Jayaraman, Singer and Stupp, filed concurrently herewith and incorporated herein by reference. However, it has been found that such combined bipolar-field effect transistor devices still may suffer from certain drawbacks, such as requiring a substantial amount of base drive current for a desired level of on-resistance and a commensurately large base drive power source, and having a significant unwanted internal power dissipation. Additionally it would be desirable to improve the isolation of the combined transistor from other devices in the same substrate, and to provide faste operation.

SUMMARY OF THE INVENTION

It is therefore an object of the present invention to provide a combined bipolar-field effect transistor RESURF device having improved on-resistance and switching characteristics, while requiring a reduced amount of base drive current for a desired level of on-resistance and having a reduced amount of unwanted internal power dissipation.

It is a further object of the invention to provide a combined bipolar-field effect transistor RESURF device in which the manufacturing yield is improved and the area occupied by the device is minimized for a given set of switching, high-voltage, and on-resistance characteristics, and in which both isolation and switching speed are improved.

In accordance with the invention, these objectives are achieved by a combined bipolar-field effect transistor RESURF device in which a semiconductor substrate of a first conductivity type is provided with a lightly-doped epitaxial buried layer of the same conductivity type on the substrate surface. This epitaxial buried layer has a doping level which is at least an order of magnitude (a factor of 10 times) less than that of the substrate. The device further includes an epitaxial surface layer of a second conductivity type on the buried epitaxial layer, with the doping concentration and thickness of this epitaxial surface layer being selected in accordance with the REduced SURface Field (RESURF) technique such that the product of doping concentration and epitaxial layer thickness ($N_{epi} \times d_{epi}$) is typically about $10^{12}$ atoms/cm$^2$. A surface-adjoining base region of the first conductivity type is provided in the epitaxial surface layer, and a highly-doped buried region of the second conductivity type is located beneath the base region and sandwiched between the epitaxial buried and surface layers. The additional active regions of the bipolar and field effect transistor devices are formed in the epitaxial surface layer.

In such a device, the improved on-resistance and switching characteristics mentioned above are achieved by using minority carriers for conductivity modulation, by exploiting the vertical base widening phenomenon, and by using a double-epi construction to confine minority carriers. These improvements are made possible by the incorporation of the lightly-doped epitaxial buried layer, which is located between the substrate and the epitaxial surface layer of the device, while the reduced base drive current requirements and reduced internal power dissipation mentioned above are made possible by the use of the highly-doped buried region.

Devices in accordance with the invention may also include a buried annular region of the first conductivity type around and in contact with the highly-doped buried region, as well as a surface-adjoining annular region of the first conductivity type adjacent the base region.

The various embodiments described above may additionally include a highly-doped buried layer, of the same conductivity type as that of the substrate, located in the substrate at its intersection with the lightly-doped epitaxial buried layer. This highly-doped buried layer serves to increase conductivity modulation in the lightly-doped epitaxial buried layer and also to enhance confinement of carriers to the lighly-doped epitaxial buried layer.

Such device not only require reduced base drive for a given level of on-resistance and provide reduced internal power dissipation, but also provide improved isolation with respect to adjacent devices on the same substrate and improved switching speed.

DESCRIPTION OF THE PREFERRED EMBODIMENTS

Figure 1:
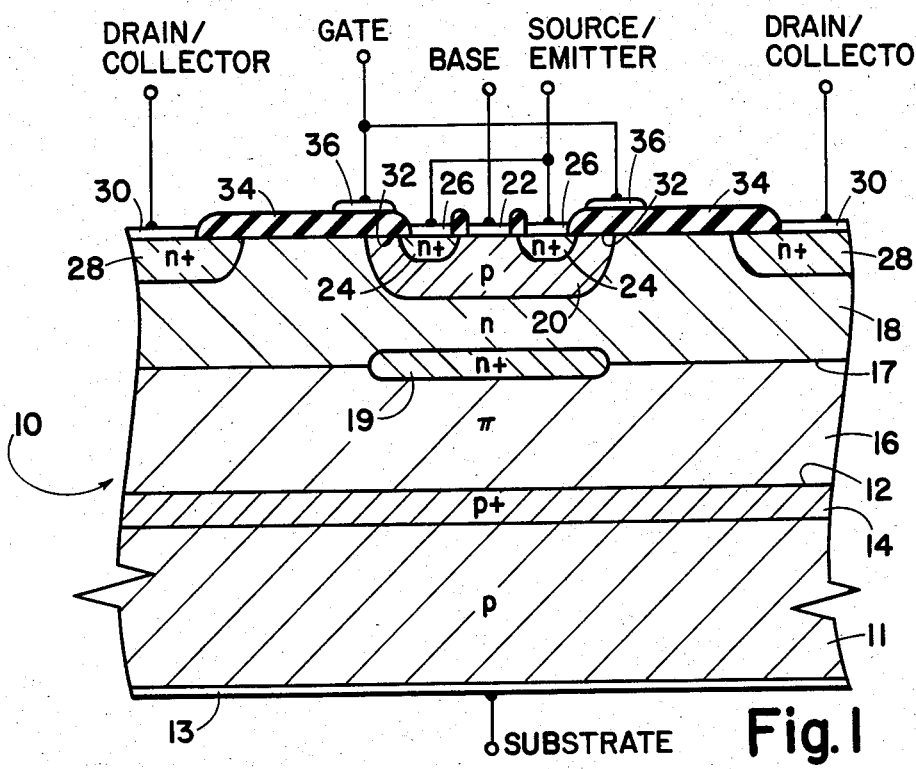
FIG. 1 is a cross-sectional view of a combined bipolar-field effect transistor RESURF device in accordance with a first embodiment of the invention.

FIG. 1 of the drawing shows a combined bipolar-field effect transistor RESURF device which is suitable for high-voltage switching applications. It should be noted that the drawing is not to scale, and in particular that the vertical dimensions are exaggerated for improved clarity. Additionally, like parts are designated with like reference numerals in the figures, and semiconductor regions of the same conductivity type are shown hatched in the same direction.

In FIG. 1, a combined bipolar-field effect transistor RESURF device 10 has a semiconductor substrate 11 with a major surface 12 on its upper side and a substrate electrode 13 on its lower side. In this example the substrate 11 is of p conductivity type and has a doping level of at least about $3 \times 10^{15}$ atoms/cm$^3$. A lightly-doped epitaxial buried layer 16 is located on surface 12 of the substrate and has a doping level of at least an order of magnitude (a factor of 10 times) less than that of the substrate. The lightly-doped epitaxial buried layer here is of pi (i.e. p-) conductivity type with a doping level of about $3 \times 10^{14}$ atoms/cm$^3$ and a thickness of about 30 microns. An epitaxial surface layer 18 of n conductivity type is located on the upper surface 17 of pi layer 16, and has a doping concentration and thickness selected in accordance with the REduced SURface Field (RESURF) technique. In this example, the epitaxial surface layer 18 has a doping level of about $10^{15}$ atoms/cm$^3$ and a thickness of about 10 microns.

In FIG. 1, a highly-doped p+ buried layer 14 is provided at major surface 12 of the substrate 11. This highly-doped p+ buried layer has a doping level of about $10^{18}$ atoms/cm$^3$ and a thickness of about 5 microns. The highly-doped buried layer 14 serves to increase the injection efficiency of the substrate 11 relative to that of the epitaxial surface layer 18, thereby increasing conductivity modulation of the pi layer 16 and creating a barrier to electron flow into the substrate, thus confining the base widening phenomenon to the pi layer 16 where it is most effective. As a result, improved device speed and better lateral isolation may be obtained. It should be understood that while buried layer 14 is shown only in FIG. 1, the devices shown in FIGS. 1, 2 and 3 may all be fabricated either with (as in FIG. 1) or without (as in FIGS. 2 and 3) this buried layer.

The active regions of the combined bipolar-field effect transistor RESURF device are formed at the upper surface of epitaxial surface layer 18. A surface-adjoining base region 20 of p conductivity type and a doping level of about $10^{17}$ atoms/cm$^3$ is provided with a base electrode 22 and a surface-adjoining source/emitter region 24 of n+ conductivity type semiconductor material, with region 24 serving as both the source and the emitter of the combined bipolar-field effect transistor device. Region 24 is provided with a source/emitter electrode 26 connected to the upper surface of the region.

Also shown in FIG. 1 is a highly-doped buried region 19, located beneath the base region 20 and sandwiched between the epitaxial buried layer 16 and the epitaxial surface layer 18 at the surface 17. In this example, buried region 19 is of n+ conductivity type and has a doping level in the range of about $10^{18}$–$10^{20}$ atoms/cm$^3$ and a thickness in the range of about 1–2 microns.

A drain/collector region 28 of n+ conductivity type is provided adjacent the surface of the epitaxial surface layer 18 and is spaced apart from the base region 20, with a drain/collector electrode 30 connected to the upper surface of the drain/collector region. Thus a lateral npn bipolar transistor is integrally formed with a lateral MOS field effect transistor.

A surface-adjoining channel region 32 is located between source/emitter region 24 and drain/collector region 28, and is at least partly located in that portion of the base region which is adjacent to the drain/collector region. This latter-mentioned portion of the channel region 24 is covered by an insulating layer 34 of a material such as silicon dioxide or other suitable insulating material, with a gate electrode 36 being provided on the insulating layer 34 and over at least that part of the channel region which is in the base region 20. Since the various active regions of the device described above are formed in a conventional manner, they will not be discussed in further detail.

The improved operational features of the present invention are achieved by using minority carriers for conductivity modulation and by exploiting the vertical base widening phenomenon typical of lateral RESURF devices to obtain lower specific on-resistances and increased yield for a given current and voltage rating. Since highly-doped n+ buried region 19 acts as a barrier to holes, hole concentration gradients are increased in the region of the base, and the base widening effects are enhanced. Additionally, the configuration of this device does not compromise the attributes of low input capacitance and ease of integration which are characteristic of devices of this general type.

In the device of FIG. 1, the pi layer 16 serves as the substrate for purposes of blocking voltage, and, during the "off" state, this layer is fully depleted. When the device of FIG. 1 is turned "on", a vertical pnp transistor is formed from regions of p layers 11 and 16, n layer 18 and p region 20. In the "on" state, layers 16 and 18 will be conductivity modulated by minority carriers.

To turn the device of FIG. 1 "on", base and gate drive signals are applied to electrodes 22 and 36, respectively, with the substrate connected to a fixed potential, in this case ground. This first activates the field effect transistor, and then, following a short delay, the lateral npn bipolar transistor switches "on". Due to the existence of a low-resistance channel region along the surface of the device, the lateral transistor switches immediately into saturation, with both the base-emitter and base-collector junctions forward biased. The forward biasing of the base-collector junction in turn triggers the vertical pnp transistor discussed above, and hole current flows to the substrate. Because of the addition of buried region 19, the beta of the vertical transistor is reduced, so that this hole current to the substrate is minimized. In this manner, the amount of base drive current for a desired on-resistance is reduced, and unwanted internal power dissipation is lowered. At the same time, desired hole current in the lateral direction is enhanced, thus improving lateral conductivity and lowering on-resistance. More particularly, the addition of buried layer 19 can reduce the required base drive current for a given level of on-resistance by a factor of two, so that a considerably smaller base drive power source may be used. Additionally, both operating speed and device isolation are improved by reducing vertical conductivity and enhancing lateral conductivity.

When the doping level of the pi layer is appropriately selected with respect to that of the underlying substrate, a potential will develop across these layers, even at a relatively low base current. If the potential drop becomes comparable to the built-in potential of the collector-base junction of the vertical pnp transistor, this transistor will also saturate. At this point, electrons will be injected from the epitaxial surface layer 18 into the highly resistive pi layer 16, effectively widening the base of the vertical pnp transistor. Due to the relatively small electric fields in layer 16, the base widening phenomenon spreads rapidly to the pi layer-substrate junction 12, where holes are also injected into the pi layer. Due to the large number of carriers injected into the pi layer from both the epitaxial surface layer 18 (from above) and the substrate 11 (from below), the intervening pi layer 16 region becomes heavily conductivity modulated. The voltage required to maintain this situation is now dropped across the substrate resistance alone. As the base current further increases, the base widening phenomenon spreads laterally through the pi layer. Additionally, lateral base widening effects in the lateral npn bipolar transistor become significant, so that eventually the entire extended epitaxial layer (layers 16 and 18) becomes further modulated due to the combined effects of both vertical and lateral base widening.

As a result, the effective cross-sectional area of the device is increased, since the pi layer in effect acts to extend the epitaxial surface layer. Furthermore, the entire extended epitaxial layer (16, 18) is conductivity modulated. As a result, the on-resistance of the device is dramatically reduced, since these two effects are nearly multiplicative in their influence on the conductive-state resistance of the device. While the device is in this conductive state, the carriers in the modulated pi layer 16 and the epitaxial surface layer 18 are maintained by a recombination current from the base region 20. Since the lifetime of the high-resistivity region is large, the recombination current will be small in comparison to the current delivered to the external load, thus enhancing device efficiency.

In addition to the advantages discussed above, the present invention also permits more design flexibility in the location of emitting and collecting regions, since these regions no longer need be alternated as in conventional lateral transistor designs. Since the pi layer is converted to n conductivity type through the base widening phenomenon, this layer may act as a low resistance buried collector region, thus permitting emitting regions to be arranged for optimum efficiency and maximum emitting surface area and packing density. The present configuration also reduces the number of regions that experience high electric fields, which increases overall device yield.

To return the device of FIG. 1 to the "off" state, base drive to electrode 22 is first removed. Holes from the modulated pi layer will then be collected through the base 20 and substrate 11. Electrons from the pi layer will flow to the drain/collector region 28. Since the current paths for both holes and electrons are relatively low resistance paths, a further advantage of the invention is that the turn-off time will be quite rapid. As the modulated pi layer is converted back to its high resistivity "off" state, current flow becomes limited to the epitaxial surface layer 18, and is handled by the field effect transistor portion of the device alone. After conversion of the pi layer is complete, the field effect transistor is switched "off" to return the device to its quiescent state.

Preliminary test results on several experimental devices in accordance with the invention indicate that a very substantial improvement in device performance can be achieved. As compared to prior art combined bipolar-field effect transistor devices, for example, "on" resistance may be decreased from 3 to 10 times, with all other performance characteristics remaining substantially constant, while incorporation of the highly-doped n+ buried region reduced the base current drive requirement by a factor of 2. When this substantial improvement in performance is combined with the other advantages mentioned above, it will be seen that the present invention constitutes a substantial commercial advance in the art.

Figure 2:
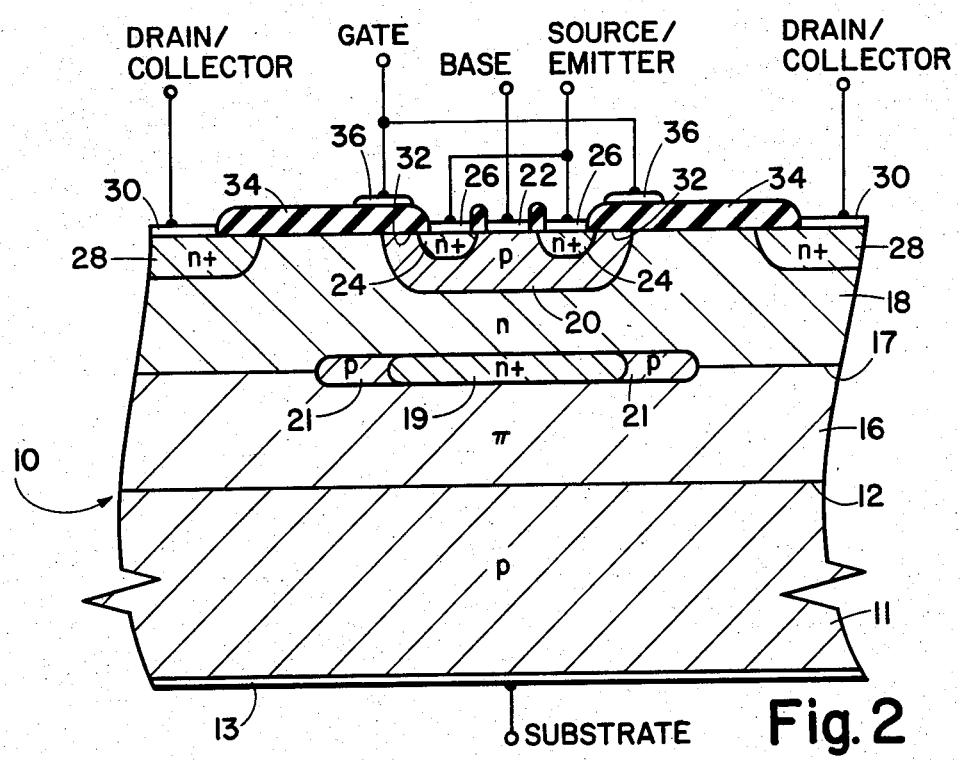
FIG. 2 is a cross-sectional view of a combined bipolar-field effect transistor RESURF device in accordance with a second embodiment of the invention.

In FIG. 2, a device as described above is additionally provided with a buried annular region 21 around and in contact with highly-doped buried region 19. In this example, the buried annular region is of p conductivity type and has a doping level in the range of about $3 \times 10^{15}$–$1 \times 10^{16}$ atoms/cm$^3$ and a thickness in the range of about 1-2 microns.

This annular region serves several purposes. During the "on" state, this region acts as an equipotential region and allows uniform conductivity modulation of the epitaxial surface layer 18. When the annular region 21 becomes forward biased, holes from the base region 20 are collected in the annular region and are reinjected back into the epitaxial surface layer. This improves the injection efficiency of the device, further lowers the amount of base drive current needed to obtain a given level of on-resistance by a factor of 2-3, and improves isolation with respect to other devices sharing the same substrate. Furthermore, during the "off" state, the annular region tends to offset the field crowding tendencies of the buried region 19, thus improving breakdown characteristics.

Figure 3:
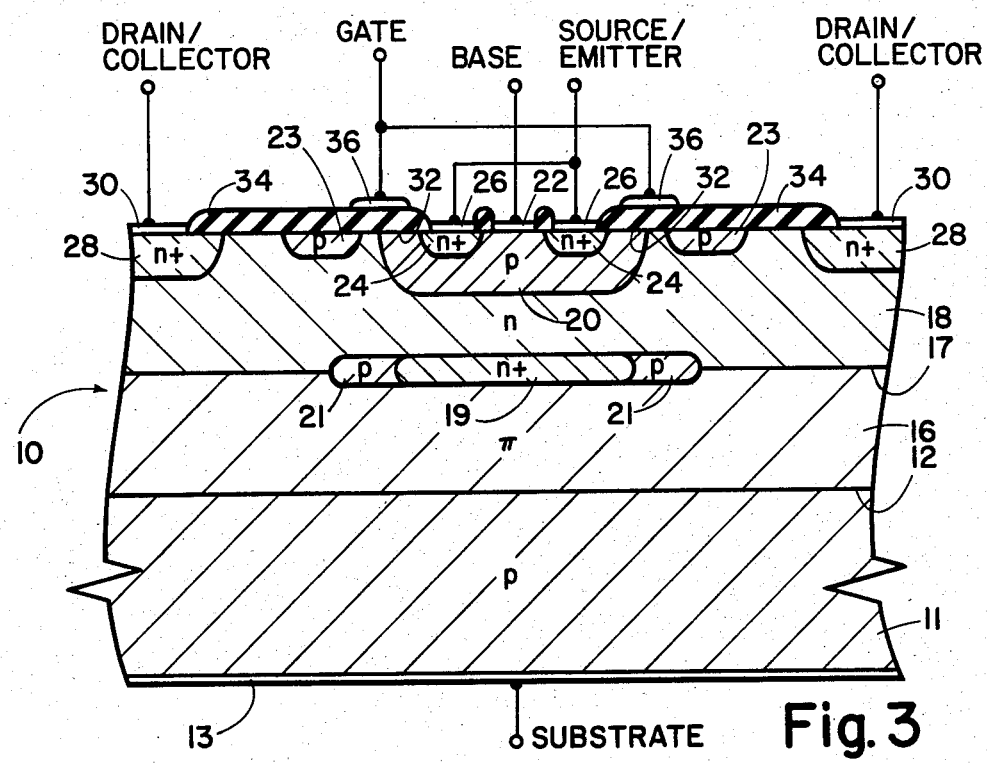
FIG. 3 is a cross-sectional view of a combined bipolar-field effect transistor RESURF device in accordance with a third embodiment of the invention.

In FIG. 3, a device having buried regions 19 and 21 as described above is further provided with a surface-adjoining annular region 23 adjacent the base region 20. Region 23 in this example is of p conductivity type, with a doping level of about $10^{16}$ atoms/cm$^3$ and a thickness of about 1 micron.

As in the case of region 21, surface-adjoining annular region 23 serves several purposes. As an additional field-shaping layer, it improves the high voltage capabilities of the device. Additionally, in the "on" state it provides uniform conductivity modulation of the epitaxial surface layer and serves as an additional source of injected holes closer to the drain region. As a result, device efficiency and speed are further improved.

Finally, while the invention has been particularly shown and described with reference to certain preferred embodiments thereof, it will be understood by those skilled in the art that various changes in form and detail may be made without departing from the spirit and scope of the invention.

We claim:

1. A combined bipolar-field effect transistor RESURF device, which comprises;
    a semiconductor substrate of a first conductivity type and having a major surface and a substrate electrode connected to the side of said substrate opposite said major surface;
    a lightly-doped epitaxial buried layer of said first conductivity type on said major surface of the substrate and having a doping level at least an order of magnitude less than that of said substrate;
    an epitaxial surface layer of a second conductivity type opposite to that of said first on said buried epitaxial layer, the doping concentration and thickness of said epitaxial surface layer being selected in accordance with the REduced SURface Field (RESURF) technique such that the product of doping concentration and epitaxial layer thickness ($N_{epi} \times d_{epi}$) is about $10^{12}$ atoms/cm$^2$;
    a surface-adjoining base region of said first conductivity type in said epitaxial surface layer;
    a base electrode connected to said base region;
    a highly-doped buried region of said second conductivity type located beneath said base region and sandwiched between said epitaxial buried layer and said epitaxial surface layer;
    a surface-adjoining source/emitter region of said second conductivity type in said base region, the source/emitter region serving both as the source and the emitter of said combined device;
    a source/emitter electrode connected to said source/emitter region;
    a surface-adjoining drain/collector region of said second conductivity type in said epitaxial surface layer and spaced apart from said base region, the drain/collector region serving as both the drain and the collector of said combined device;
    a drain/collector electrode connected to said drain/collector region;
    a surface-adjoining channel region at least partly in a peripheral portion of said base region which is nearest said drain/collector region;
    an insulating layer on said surface layer and covering at least that part of said channel region which is in said base region; and
    a gate electrode on said insulating layer and over at least that part of said channel region which is in said base region.

2. A combined bipolar-field effect transistor RESURF device as in claim 1, wherein said lightly-doped epitaxial buried layer is of pi conductivity type and has a doping level of about $3 \times 10^{14}$ atoms/cm$^3$ and a thickness of about 30 microns, and said highly-doped buried region is of n+ conductivity type and has a doping level in the range of about $10^{18}$–$10^{20}$ atoms/cm$^3$ and a thickness in the range of about 1–2 microns.

3. A combined bipolar-field effect transistor RESURF device as in claim 1, further comprising a highly-doped buried layer of said first conductivity type in said substrate at said major surface, the doping level of said highly-doped buried layer being greater than that of said substrate.

4. A combined bipolar-field effect transistor RESURF device as in claim 3, wherein said lightly-doped epitaxial buried layer is of pi conductivity type and has a doping level of about $3 \times 10^{14}$ atoms/cm$^3$ and a thickness of about 30 microns, said highly-doped buried layer is of p+ conductivity type and has a doping level of about $10^{18}$ atoms/cm$^3$ and a thickness of about 5 microns, and said highly-doped buried region is of n+ conductivity type and has a doping level in the range of about $10^{18}$–$10^{20}$ atoms/cm$^3$ and a thickness in the range of about 1–2 microns.

5. A combined bipolar-field effect transistor RESURF device as in claim 1, 2, 3 or 4, further comprising a buried annular region of said first conductivity type around and in contact with the highly-doped buried region of said second conductivity type.

6. A combined bipolar-field effect transistor RESURF device as in claim 5, wherein said buried annular region is of p conductivity type and has a doping level in the range of about $3 \times 10^{15}$–$1 \times 10^{16}$ atoms/cm$^3$ and a thickness in the range of about 1–2 microns.

7. A combined bipolar-field effect transistor RESURF device as in claim 5, further comprising a surface-adjoining annular region of said first conductivity type adjacent said base region.

8. A combined bipolar-field effect transistor RESURF device as in claim 7, wherein said surface-adjoining annular region is of p conductivity type and has a doping level of about $10^{16}$ atoms/cm$^3$ and a thickness of about 1 micron.

* * * * *